United States Patent
Bacher

(10) Patent No.: US 6,839,377 B2
(45) Date of Patent: Jan. 4, 2005

(54) OPTOELECTRONIC DEVICE HAVING A FIBER GRATING STABILIZED PUMP MODULE WITH INCREASED LOCKING RANGE AND A METHOD OF MANUFACTURE THEREFOR

(75) Inventor: Kenneth L. Bacher, Macungie, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/253,162

(22) Filed: Sep. 24, 2002

(65) Prior Publication Data

US 2003/0081646 A1 May 1, 2003

Related U.S. Application Data

(63) Continuation-in-part of application No. 10/062,221, filed on Oct. 26, 2001, now abandoned.

(51) Int. Cl.$^7$ .............................................. H01S 3/08
(52) U.S. Cl. ...................................................... 372/102
(58) Field of Search ............................. 372/6, 102, 96, 372/45

(56) References Cited

U.S. PATENT DOCUMENTS

| | | | |
|---|---|---|---|
| 5,724,377 A | | 3/1998 | Huang |
| 5,757,828 A | * | 5/1998 | Ouchi ........................ 372/27 |
| 5,841,799 A | * | 11/1998 | Hiroki ........................ 372/19 |
| 6,240,119 B1 | * | 5/2001 | Ventrudo .................... 372/96 |
| 6,301,272 B1 | * | 10/2001 | Koch et al. ................... 372/6 |
| 6,310,899 B1 | * | 10/2001 | Jacobovitz-Veselka et al. 372/6 |
| 6,337,868 B1 | * | 1/2002 | Mizutani ..................... 372/27 |
| 6,434,172 B1 | * | 8/2002 | DiGiovanni et al. .......... 372/6 |
| 6,480,513 B1 | * | 11/2002 | Kapany et al. ............... 372/20 |
| 6,525,872 B1 | * | 2/2003 | Ziari et al. ............... 359/341.3 |
| 6,560,247 B2 | * | 5/2003 | Chang et al. .................. 372/6 |
| 6,580,734 B1 | * | 6/2003 | Zimmermann ........... 372/29.02 |
| 6,580,740 B2 | * | 6/2003 | Funabashi et al. ............ 372/50 |
| 6,594,288 B1 | * | 7/2003 | Putnam et al. ................. 372/3 |
| 6,614,823 B2 | * | 9/2003 | Funabashi et al. ............ 372/45 |
| 6,760,151 B1 | * | 7/2004 | Vail et al. ............... 359/341.3 |
| 2002/0015433 A1 | * | 2/2002 | Zimmermann ............... 372/96 |
| 2002/0048300 A1 | * | 4/2002 | Tsukiji et al. ................. 372/43 |
| 2002/0154665 A1 | * | 10/2002 | Funabashi et al. ............ 372/45 |
| 2002/0163948 A1 | * | 11/2002 | Yoshida et al. ............... 372/45 |
| 2003/0016720 A1 | * | 1/2003 | Funabashi et al. ............ 372/96 |
| 2003/0021305 A1 | * | 1/2003 | Lundqvist .................... 372/20 |
| 2003/0043454 A1 | * | 3/2003 | Yoon et al. ............... 359/341.3 |
| 2003/0043878 A1 | * | 3/2003 | Funabashi et al. ............ 372/96 |
| 2003/0062528 A1 | * | 4/2003 | Yoshida et al. ............... 257/79 |
| 2003/0063643 A1 | * | 4/2003 | Yoshida et al. ............... 372/45 |

* cited by examiner

*Primary Examiner*—Don Wong
*Assistant Examiner*—Hung T Vy

(57) ABSTRACT

The present invention provides an optoelectronic device, a method of manufacture therefor and an optical communications system including the same. In an exemplary embodiment, the optoelectronic device includes a device body that includes an active region having a device length defined by a back facet and a front facet. The device includes an internal grating to enhance spectral performance. The optoelectronic device further includes an anti-reflective coating on the front facet and a grated waveguide located adjacent said front facet.

20 Claims, 3 Drawing Sheets

OPTOELECTRONIC DEVICE HAVING A FIBER GRATING STABILIZED PUMP MODULE WITH INCREASED LOCKING RANGE AND A METHOD OF MANUFACTURE THEREFOR

CROSS-REFERENCE TO RELATED APPLICATIONS

This application is a continuation-in-part of U.S. patent application Ser. No. 10/062,221, entitled "An Optoelectronic Device Having a Diffraction Grating Associated Therewith and a Method of Manufacture Therefor," filed on Oct. 26, 2001 now abandoned. The above-listed application is commonly assigned with the present invention and is incorporated herein by references as if reproduced herein in its entirety.

TECHNICAL FIELD OF THE INVENTION

The present invention is directed, in general, to an optoelectronic device and, more specifically, a laser having an anti-reflective coating and grated waveguide associated therewith, a method of manufacture therefor, and an optical communications system including the same.

BACKGROUND OF THE INVENTION

Optoelectronic devices, such as lasers for use in optical communication systems, have to meet very stringent requirements. More specifically, the wavelength locking range of a laser is an important parameter to control and stabilize. In certain applications, however, large changes in environmental temperature, or operating current variations, may cause the laser to become unlocked or locked at the wrong wavelength of light. For example, in submarine applications, where lasers are meant to operate in undersea fiber links, the variation in operating temperature may exceed 40° C. Moreover, there is no thermoelectric cooler in the device package to control the laser chip temperature.

One well-known means of stabilizing the locking range involves coupling an external grated waveguide, such as a fiber-Bragg-grating, to a Fabry-Perot (F-P) laser chip at the output facet of the laser. F-P lasers have a broadband low reflectivity (LR) coating on the output facet. This relatively flat reflectivity spectrum allows the laser to operate in the range of wavelengths where the gain is the highest, the so-called chip wavelength. Grated waveguides, such as Fiber-Bragg-gratings, have their own wavelength of maximum reflectivity, the so-called grating wavelength. For example, when a fiber-Bragg-grating is coupled to the output facet of a F-P laser, so long as the chip and the grating wavelengths are substantially similar, the laser can lock and lase at the grating wavelength, instead of the chip wavelength. Under the above mentioned conditions, however, because the gain spectrum of the chip is sensitive to temperature, the chip wavelength may shift significantly away from the grating wavelength. Consequently, instead of oscillating or locking at the grating wavelength, the laser will prefer to lase at the chip wavelength. Under such circumstances the chip laser is said to be outside of the locking range of the grating waveguide.

Previous efforts to resolve this problem have not lead to entirely satisfactory solutions. For example, the locking range of a fiber-Bragg-grating stabilized F-P laser may be increased by increasing the maximum reflectivity of the fiber-Bragg-grating. However, increased grating reflectivity may result in reduced output power. This may be especially severe for longer higher-power laser chips that function optimally with a high output coupling. Alternatively, the necessary locking range may be reduced by specifying a reduced operating temperature for the product. But a reduced operating temperature range may not be attractive to customers because this requires increased inventory management. Finally, a grating internal to the laser chip, such as a diffraction grating, may be used to form a distributed feed back (DFB) laser to facilitate stabilization of the lasing wavelength, instead of an external fiber-Bragg-grating. However, such DFB lasers are unattractive for use in uncooled Raman applications, because such lasers still have a significantly greater temperature dependent shift (i.e., chip wavelength ~0.09 nm/° C.), as compared to the temperature dependence of a laser coupled to an external grated waveguide (i.e., grating wavelength ~0.01 nm/° C.).

Accordingly, what is needed in the art is an optoelectronic device having an increased locking range that does not experience the drawbacks encountered by the conventional devices and resolutions listed above.

SUMMARY OF THE INVENTION

To address the above-discussed deficiencies of the prior art, the present invention provides an optoelectronic device, a method of manufacture therefor, and an optical communications system including the same. In an exemplary embodiment, the optoelectronic device includes a device body including an active region having a device length defined by a back facet and a front facet, an internal grating located adjacent said active region, an anti-reflective coating on the front facet, and a grated waveguide located adjacent the front facet. The grated waveguide is configured to cause a portion of radiation emanating from the device body to be reflected back through the front facet and into the device body.

In another embodiment, the present invention provides a method of manufacturing the optoelectronic device. The method comprises providing the device body as described above with an internal grating located adjacent said active region, layering an anti-reflective coating on the front facet and forming a grated waveguide and coupling the waveguide to the front facet so as to provide an optical path between the active region and the waveguide.

Yet another embodiment provides an optical communications system, comprising the above-described optical device, an optical waveguide coupled to the grated waveguide and an optical receiver and transmitter coupled to the optical device.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description, when read with the accompanying FIGURES. It is emphasized that in accordance with the standard practice in the optoelectronic industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention uses a device body having and active region defined by a back and front facet, an anti-reflective coating on the front facet and a grated waveguide located adjacent the front facet cooperate to create an optoelectronic device. The optoelectronic device, for example a laser, is thereby capable of locking over a broader range of wavelengths of radiation, even in the presence of wide temperature variations in operating conditions, for example 40° C. or more, as compared to existing lasers.

For the purposes of the present invention, radiation is defined as any electromagnetic wave capable of being emitted by a radiation source. For example, in certain preferred embodiments, the radiation may be an optical wave comprising coherent light emitted by an optical laser source. The minimal reflectivity associated with the grated waveguide allows for maximization of the emitted radiation, or output power, of the device. The device of the present invention is also more tolerant, compared to existing devices, to variations in the epitaxial growth of the active region without yield fallout for wavelength.

Figure 1:
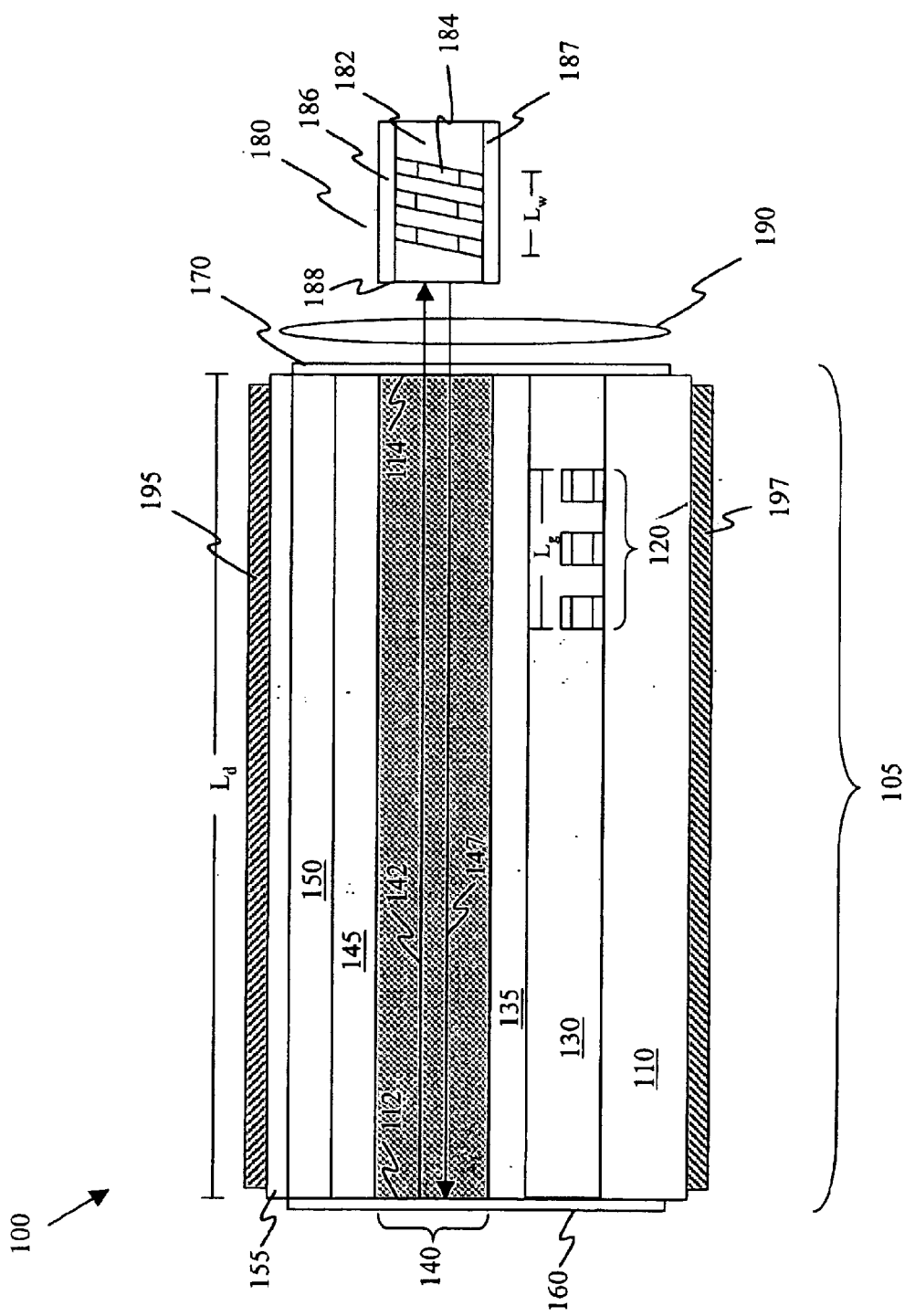
FIG. 1 illustrates a cross-sectional view of an optoelectronic device, which has been constructed in accordance with the principles of the present invention.

Referring initially to FIG. 1, illustrated is a cross-sectional view of an optoelectronic device 100, which has been constructed in accordance with the principles of the present invention. It should be noted that the cross-sectional view of the optoelectronic device 100 depicted in FIG. 1 is along a length of the optoelectronic device 100. As such, radiation traversing through the optoelectronic device 100 illustrated in FIG. 1, would typically move from right to left and from left to right across the page.

The present invention is directed to an optoelectronic device 100 made of any material or compound that may have use in such devices. In the illustrative embodiments described herein, the optoelectronic device 100 is specifically discussed as a group III-V based device, for example an indium phosphide/indium gallium arsenide phosphide (InP/InGaAsP) based device, a gallium arsenide (GaAs) based device, an aluminum gallium arsenide (AlGaAs) based device, or another group III-V based device. Even though the present invention is discussed in the context of a group III-V based device, it should be understood that the present invention is not limited to group III-V compounds and that other compounds located outside groups III-V may be used.

In the illustrative embodiment shown in FIG. 1, the optoelectronic device 100, includes a device body 105. Formed within the device body in the illustrative embodiment shown in FIG. 1, are an optoelectronic substrate 110, have a back and front facet 112, 114. Also illustrated are a internal grating, such as a diffraction grating 120, spacer layer 130, an active region 140, lower and upper confinement layers 135 145, upper cladding layer 150, and capping layer 155.

The optoelectronic device 100, further includes a back facet coating 160 and an anti-reflective coating 170, located on the back and front facet 112, 114, respectively. In addition, a grated waveguide 180, is located adjacent the front facet 114. The grated waveguide 180 includes a core 182, a grating 184 located within the core 182 and an upper and lower outer cladding 186, 187, respectively. The active region 140 has a device length, $L_d$, defined by the back and front facet, 112, 114. The grated waveguide 120 is configured to cause a portion of radiation, indicated by arrow 142, emanating from the device body, to be reflected back through the front facet 114 and into the device body, 105, the direction of which is indicated by arrow 147. In certain preferred embodiments, the device 105 further includes a lens 190 located between the anti-reflective coating 170, and the grated waveguide 180. The optional lens 190 may be any conventional focusing element to facilitate the optical coupling of radiation 142, 147, between the active region 140 and the grated waveguide 180.

The device body 105 further includes a conventionally formed internal grating 120, such as a diffraction grating 120, located adjacent the active region 140. For example, the diffraction grating 120 may be formed either under, as depicted in FIG. 1, or over the active region 140 (not shown). In such embodiments, the diffraction grating 120 may be used to obtain an increase in reflectivity over the AR coating 170, between about −20 and about −30 dB (absolute reflectivity of diffraction grating 120) in a range of wavelengths about the desired wavelength. This, in turn, facilitates the provision of a stable output spectrum around the desired wavelength of operation of the device 100.

The active region 140 may, for example, be an active region of a Fabry Perot (F-P), Distributed Feedback (DFB) or Distributed Bragg Reflector (DBR) laser. In the particular embodiment shown in FIG. 1, the active region 140 comprises a number of quantum well regions, however, any type of radiation cavity 140 is within the scope of the present invention.

In an exemplary embodiment, the back facet coating 160 is preferably a conventional high reflection (HR) coating. As noted above, located on a front facet 114 of the optoelectronic device 100, is the anti-reflective (AR) coating 170. In certain preferred embodiments, the AR coating 170 may comprise a single layer of a material having an index of refraction that is equal to about the square root of the effective index of refraction of the waveguide 180, further discussed below. In yet other preferred embodiments, the AR coating 170 may have a thickness 175, that when multiplied by the index of refraction, equals about one quarter of the wavelength of the desired radiation 142, 147. In still even more preferred embodiments, the AR coating 170 may comprise multiple layers whose index of refraction and thickness 175 are selected, based on similar criterion as discussed above, to provide low reflectivity over the entire active region 140. For example in certain embodiments, the reflectivity is less than about −35 dB, and more preferably, less than about −40 dB. The embodiment of the optoelectronic device 100 illustrated in FIG. 1, further includes a conventional upper electrical contact 195, and a conventional lower electrical contact 197.

In yet other embodiments, the grated waveguide 180 may be a Bragg grated waveguide. The grated waveguide may be comprised of a conventional optical fiber having a fiber grating, such as a Bragg grating, located therein. In certain embodiments. the Bragg grating may have a peak reflectivity of between about 1% and about 6%, and preferably between about 2% and about 3%. In yet other embodiments, the bandwidth of the grating 180 (i.e., full width at half maximum) is at least about 3 times the cavity mode spacing of the device body 105. In certain preferred embodiment, for example, the bandwidth is preferably about 1 nm to 2 nm for a cavity made spacing of about 0.16 nm. In still other preferred embodiments, the peak grading reflectivity is selected to be approximately equal to the desired wavelength of operation for the device 100. In yet other preferred embodiments, the grated waveguide 180 is located between about 5 inches and 40 inches from the front facet 114.

As illustrated in FIG. 1, in certain embodiments, the diffraction grating 120 has a length ($L_g$). In such embodiments, the diffraction grating 120 may be further characterized by a product, $k \cdot L_g$, wherein k is a grating coupling constant of the diffraction grating. The value of $k \cdot L_g$ ranges from about 0.01 to about 0.15, and more preferably from about 0.01 to about 0.08. In advantageous embodiments of the present invention, the diffraction grating 120 is located proximate the front facet 114. For example, in an exemplary embodiment, the diffraction grating 120 is offset from the front facet by a distance ranging from about 10 μm to about 300 μm. This offset, advantageously allows for errors in a subsequent cleaving process, without substantially reducing the already minimized diffraction grating length ($L_g$) It should be noted, however, other embodiments exists. In other preferred embodiments, the internal grating is configured to have a reflectivity that causes the optoelectronic device to simultaneously operate on multiple cavity modes, at low bias currents. This provides stable operation at low power.

In certain preferred embodiments, the internal grating comprising a diffraction grating 120 has a grating length ($L_g$) of less than about 4% of the device length ($L_d$). The reduced length of $L_g$ relative to $L_d$ causes a bandwidth of the grating reflectivity to be significantly wider than the cavity mode spacing. In addition, multiple cavity modes near the peak reflectivity of the grating lase simultaneously resulting in a stable emission spectrum. In one example, a grating length ($L_g$) of about 20 μm to about 50 μm and a device length ($L_d$) of about 2.0 mm provides a Full Width Half Maximum (FWHM) of the grating reflectivity that exceeds about 15 nm while the cavity mode spacing is about 0.16 nm.

In certain preferred embodiment, located over the internal grating 120, illustrated as a diffraction grating 120 in FIG. 1, may be a spacer layer 130. The spacer layer 130 may be specifically tailored to provide a particular reflectivity for the diffraction grating 120. The precise control of the output reflectivity may be obtained by well controlled epitaxial growth of the spacer layer 130 and photolithography of the grating length ($L_g$). The precise control of the output reflectivity may further provide substantially optimized output power. For example, in certain preferred embodiments, the spacing layer 130 has a thickness ranging from about 0.15 μm to about 1 μm between the internal grating 120 and the active region 140.

Figure 2:
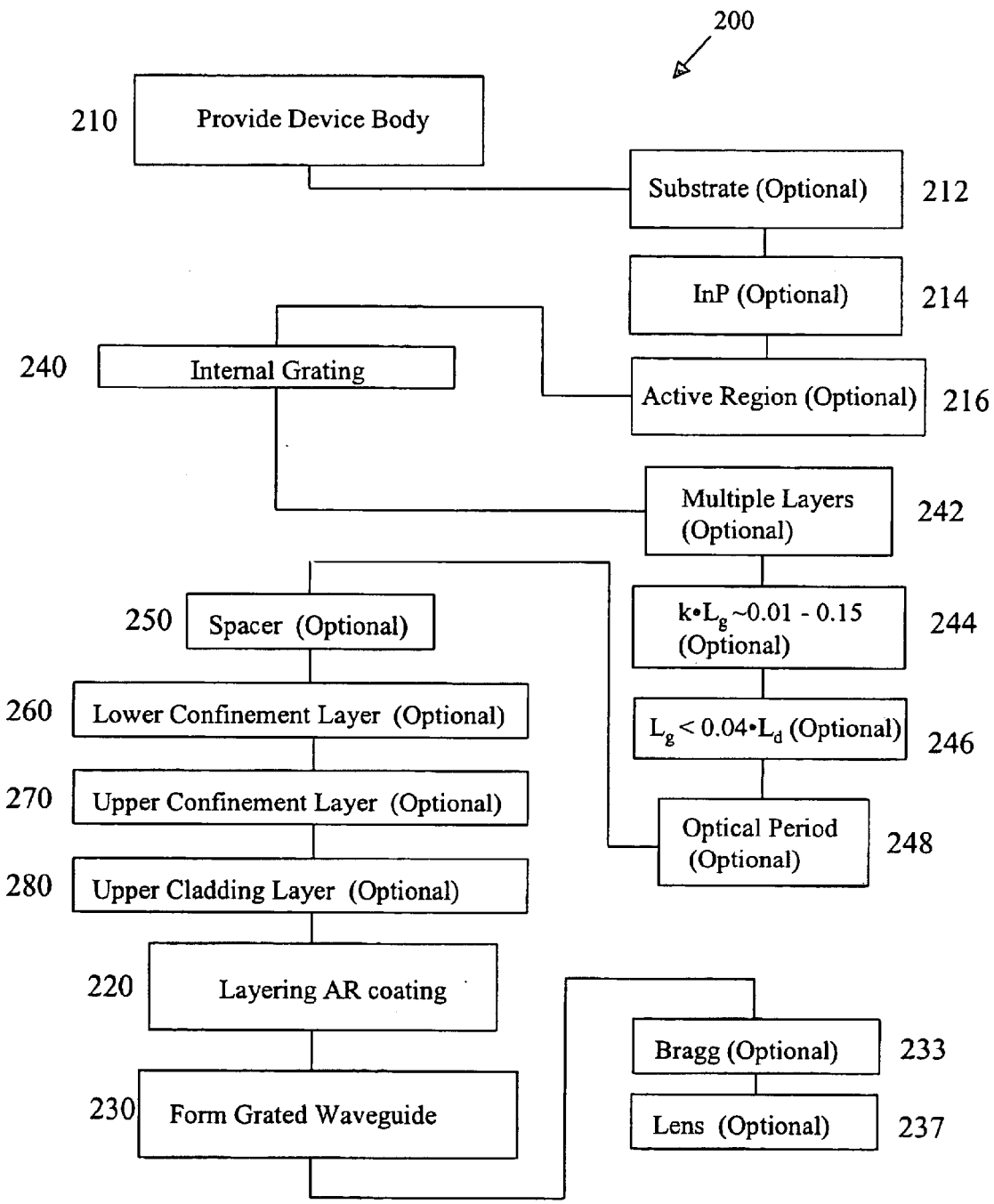
FIG. 2 illustrates by flow diagram, a method of manufacturing a optoelectronic device according to the present invention.

Turning now to FIG. 2, with continuing reference to FIG. 1, illustrated is a flow diagram of one embodiment of a method 200 of manufacturing an optoelectronic device, similar to the optoelectronic device 100 illustrated in FIG. 1. The method 200, comprises a step 210 of providing a device body including an active region 140 having a device length $L_d$ defined by a back facet 112 and front facet 114. The method 200 continues with a step 220 of layering the anti-reflective (AR) coating 170 on the front fact 114. Next follows a method step 230 of forming a grated waveguide 180 and coupling the waveguide 180 to the front facet 114 so as to provide an optical path between the active region 140 and the waveguide 180.

Providing the device body 210 may further include the step 212 of providing an optoelectronic substrate. In turn, the optoelectronic substrate 110 may be any layer located in an optoelectronic device 100, including a layer located at a wafer level or a layer located above or below the wafer level. Providing the optoelectronic substrate 212 in an exemplary embodiment, includes providing a n-type doped indium phosphide (InP) substrate 214. The n-type dopant may comprise various elements, however, in an exemplary embodiment the n-type dopant comprises sulphur. Providing other optoelectronic substrates however, are within the scope of the present invention.

Providing the device body 210 may further comprise the step 216 of providing the active region 140. As noted above the active region 140 may comprise a number of quantum well regions. Forming 216 the active region 140 may proceed using a variety of conventional processes. For example, in one embodiment, the active region 140 may be formed using a conventional epitaxial process, such as a metalorganic vapor-phase epitaxy, or other similar process. In an exemplary embodiment of the invention, the active region 140 includes materials chosen from group III-V compounds. The active region 140 is typically intentionally not doped, however, in an alternative embodiment, it may be doped as long as a p-n junction placement is taken into consideration.

The method 200 further include the step 240 of forming an internal grating, such as a diffraction grating 120, located adjacent the active region 140. For example, in certain embodiments, the internal grating 120 may comprise a diffraction grating formed either over or under the optoelectronic substrate. Forming the diffraction grating 240 may, in alternative embodiments, comprise the step 242 of forming multiple layers. For example, the diffraction grating 120 may comprise a first grating layer comprising InP, a second grating layer comprising a quaternary material such as InGaAsP, and a third grating layer comprising InP. Such layers may be formed using various conventional processes. For example, in one embodiment, they may be formed using a conventional epitaxial process, such as a metalorganic vapor-phase epitaxy, or other similar process.

In alternative preferred embodiments, forming the diffraction grating 240, may further comprise the step 244 of forming the diffraction grating 120 of sufficient length, $L_g$, and grating coupling constant, k, such that the product $k \cdot L_g$ falls within a preferred range For example, the value of $k \cdot L_g$ preferably ranges from about 0.01 to about 0.15, and more preferably from about 0.01 to about 0.08. In this and other preferred embodiments, the diffraction grating 140 may further be formed offset from the front facet 114 by a distance ranging from about 0 μm to about 300 μm.

In yet other advantageous embodiments, forming the internal grating 240, may further comprise the step 246 of forming the diffraction grating length ($L_g$) having less than about 4% of the device length ($L_d$). One example provides forming a device length ($L_d$) of greater than about 1.3 mm and a grating length ($L_g$) ranging from about 20 μm to about 50 μm.

Forming the internal grating 240 may proceed using various conventional processes, well know to those of ordinary skill in the art. For example, when the internal grating comprises a diffraction grating 120, the grating 120 may be fabricated using a two step photolithographic process. In a first step, a selective grating mask is used to expose photoresist over areas of grating layer structure where the grating is not desired. Subsequently, a holographic grating exposure across the entire surface of grating layer structure is performed. When the photoresist is developed, the grating pattern only exists in the areas protected by the selective grating mask in the first step. Thus, when the photoresist is developed and the grating layer structure is etched, the diffraction grating 120 is formed.

Precise control of the front facet reflectivity may be realized by the aforementioned diffraction grating. For example, a thickness of additional grating layers may be altered to provide a specific diffraction grating depth, thereby improving front facet reflectivity. Or, in the step of forming the internal grating 240, the diffraction grating length ($L_g$) may be optimized to improve front facet reflectivity control. And, as further discussed below, the thickness of the spacer layer 130 may be optimized, also providing an improved front facet reflectivity control.

In an advantageous embodiment, forming the internal grating 240 may further include varying the optical period 248 of the diffraction grating 120 along the device length to obtain a more optimum reflectivity spectrum for the diffraction grating 120. This can be accomplished by varying either the physical period grating (e.g., a "chirped" grating) or average effective index of refraction in the grating region of the cavity. For example, a variation of the grating period in the range of about 0.02% to about 0.2% along its length can provide for a substantially "flatter" reflectivity peak for a given reflectivity bandwidth. The same effect can be achieved with a constant physical grating period by varying the lateral dimension, for example changing the mesa width from about 2.4 $\mu$m to about 2.7 $\mu$m, in the diffraction grating region. This embodiment can allow one skilled in the art to separately control the stability of the wavelength and the side mode suppression ratio, preferably to minimize the side mode suppression ratio while maintaining tight control of the lasing wavelength.

Other embodiments of the method 200, may further include the step 250 of forming a spacer layer 130 over the diffraction grating 120. For example, the spacer layer may have a thickness ranging from about 0.15 $\mu$m to about 1 $\mu$m between the diffraction grating 120 and active region 140. The thickness is generally dependent on a desired strength of a reflectivity associated with the diffraction grating 120, thus, a wide range of thicknesses are within the scope of the present invention. In certain embodiments of the present invention, the spacer layer 130 may also be located between individual protrusions of the diffraction grating 120. The spacer layer 130 may comprise n-type doped InP, although other materials, doped or undoped, may be used. Forming the spacer layer 260 may proceed using various well-known processes. For example, in one embodiment, the spacer layer 130 may be formed using a conventional epitaxial process, such as a metalorganic vapor-phase epitaxy, or other similar process. In one exemplary embodiment, the optoelectronic substrate 110, the diffraction grating 120, and the spacer layer 130 form a lower cladding layer for the optoelectronic device 100.

Other preferred embodiments of the method 200, may further include the step 260 of forming a lower confinement layer 135. The lower confinement layer 135, in an exemplary embodiment, may include a conventional undoped InGaAsP confinement layer. The lower confinement layer 135, however, is not limited to an undoped InGaAsP layer, and other materials, doped or undoped, may be used. For example, in one particular embodiment, the lower confinement layer 135 comprises two different lower confinement layers having varying compositions of InGaAsP. Forming the lower confinement layer 260 may proceed using any number of conventional fabrication processes. For example, in one embodiment, the lower confinement layer 135 may be formed using a conventional epitaxial process, such as a metalorganic vapor-phase epitaxy, or other similar process.

Other preferred embodiments of the method 200, may further include the step 270 of forming an upper confinement layer 145, such as conventionally made p-type doped InGaAsP confinement layer, although other materials, doped or undoped, may be used. For example, in one particular embodiment, the upper confinement layer 145 comprises two different upper confinement layers having varying compositions of InGaAsP.

Other preferred embodiments of the method 200, may further include the step 280 of forming an upper cladding layer 150 over the active region 140 and upper confinement layer 145. The upper cladding layer 150 may include a conventional InP cladding layer having a dopant formed therein. The dopant is typically a p-type dopant such as zinc, although other dopants, such as carbon or beryllium, may be used. The upper cladding layer 145 may be formed using a conventional epitaxial process, for example a metalorganic vapor-phase epitaxy, or other similar process.

After formation of the upper cladding layer 280, the capping layer 155, the back facet coating 160, the front facet coating 170, the upper contact 195 and the lower contact 197 (all illustrated in FIG. 1) may all be conventionally formed, resulting in a device similar to the completed optoelectronic device 100 illustrated in FIG. 1.

In an exemplary embodiment, lateral definition of the optoelectronic device 100 may be accomplished prior to completion thereof. In such an embodiment, an initial upper cladding layer 150 would be grown on the active region 140 and upper confinement layer 145, and then masked and etched. Next, areas outside of the active region 140 would be regrown with a confinement material, such as InP, for optical and electrical confinement thereof. Then, the manufacturing process 200 would continue as described above, by forming the upper cladding layer 280.

Alternatively, a ridge waveguide structure could be formed in conjunction with the optoelectronic device 100. In such an example, and after formation of the capping layer 155, the optoelectronic device 100 could be etched laterally to provide lateral electrical confinement for the active region 140. An insulation material would then be deposited on the etched regions of the optoelectronic device 100, providing lateral optical confinement therefor. Then, the upper contact 195 and the lower contact 197 could be formed. While certain embodiments have been illustrated and discussed, other embodiments, many of which have not been discussed, are within the scope of the present invention.

Certain advantageous embodiments of the manufacturing method 200, forming the grated waveguide 230 further includes the step 233 of forming a Bragg-grated waveguide 180. In yet other advantageous embodiments, forming the grated waveguide 230 further includes the step 237 of providing a lens 190 located between the anti-reflective coating 170 and the grated waveguide 180. In still other exemplary embodiments, In yet other embodiments, the Bragg-grating 180 may be formed so as to provide the peak wavelength, peak reflectivity and bandwidth discussed herein. In certain preferred embodiments, forming the grated waveguide includes locating the waveguide 180 between about 12 cm and about 102 cm from the front facet 114.

Figure 3:
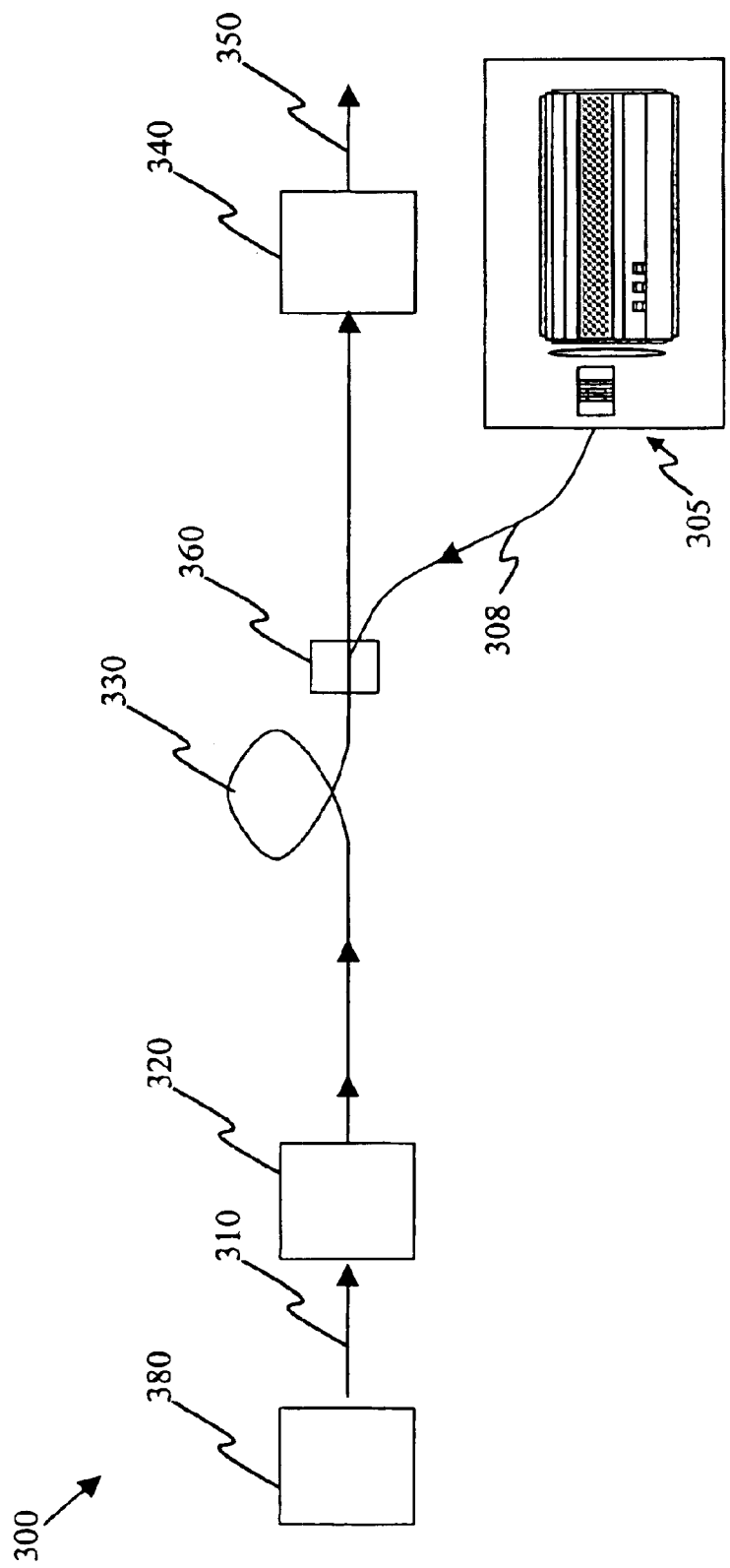
FIG. 3 illustrates an optical communication system, which may form one environment where an optoelectronic device, similar to the optoelectronic device shown in FIG. 1, may be included.

Turning to FIG. 3, illustrated is an optical communication system 300, which may form one environment where an optical device 305, similar to the optoelectronic device 100 shown in FIG. 1, may be included. Analogous to the device shown in FIG. 1, and as described in detail herein, the optical device 305, includes a device body that includes an active region 140 defined by back 112 and front facets 114, an internal grating 120 located adjacent the active region 140, an anti-reflective coating 170 on the front facet 114 and grated waveguide 180 located adjacent the front facet 114 (all illustrated in FIG. 1). All other alternative and preferred embodiments described in the context of the device 100, shown in FIG. 1, may be equally applied to the device 305 incorporated into the optical communication system 300. The optical communication system 300 include may further include an initial signal 310, generated by the optical transmitter 380, entering a source device 320. The source device 320, may comprise a number of different devices, however, in an exemplary embodiment the source device 320 comprises an optical signal source, an erbium doped fiber amplifier or a repeater. An optical waveguide 330 coupled to the grated waveguide 180 may also be included in the system 300. Additionally the system 300 includes an optical transmitter device 380 and optical receiver device 340 coupled to the optical device 305 which addresses and sends a signal 350.

As illustrated in FIG. 3, the completed optical device 305 may be positioned proximate the receiver device 340. In such an example, an output signal 308 of the optical device 305 would counter-propogate with the signal 310, and provide amplification therefor. In an exemplary embodiment, an optical combiner 360 could be used to couple the output signal 308 to the signal transmission fiber 330. In as much, the optical devices 305, may act as amplification sources for an already present signal (e.g., Raman amplification), as compared to a signal sources as used in many of the prior art applications.

In certain preferred embodiments of the optical communication system 300, the optical device 305 is a laser. The optical communication system 300, however, is not limited to merely the devices previously mentioned. For example, the optical communication system 300 may further include various photodetectors, optical combiners and optical amplifiers.

Although the present invention has been described in detail, those skilled in the art should understand that they can make various changes, substitutions and alterations herein without departing from the scope of the invention.

What is claimed is:

1. An optoelectronic device, comprising:
   a device body including an active region having a device length defined by a back facet and a front facet;
   an internal grating located within said device body and adjacent said active region and said front facet and being closer to said front facet than said back facet;
   an anti-reflective coating on said front facet; and
   an external grated waveguide located adjacent said front facet, said external grated waveguide configured to cause a portion of radiation emanating from said device body to be reflected back through said front facet and into said device body.

2. The optoelectronic device as recited in claim 1, wherein said device further including a lens located between said anti-reflective coating and said external grated waveguide.

3. The optoelectronic device as recited in claim 1, wherein said device body has a device length ($L_d$) and said external grated waveguide has a diffraction grating length ($L_g$) of less than about 4% of said device length ($L_d$).

4. The optoelectronic device as recited in claim 1, wherein said external grated waveguide is located between about 12 and about 102 cm from said front facet.

5. The optoelectronic device as recited in claim 1 wherein said internal grating comprises a diffraction grating whose length, when multiplied by a grating coupling constant of said diffraction grating, ranges from about 0.01 to about 0.15, and said diffraction grating is offset from said front facet by a distance ranging from about 0 $\mu$m to about 300 $\mu$m.

6. The optoelectronic device as recited in claim 5, wherein said internal grating is configured to have a reflectivity that causes said optoelectronic device to simultaneously operate on multiple cavity modes at low bias currents, thereby providing stable operation at low power.

7. The optoelectronic device as recited in claim 5, wherein said device length is greater than about 1.3 mm and said diffraction grating length ranges from about 10 $\mu$m to about 50 82 m.

8. The optoelectronic device as recited in claim 1 wherein said optoelectronic device further includes a spacer layer having a thickness ranging from about 0.15 $\mu$m to about 1 $\mu$m between said internal grating and said active region.

9. A method of manufacturing an optoelectronic device, comprising:
   providing a device body including an active region having a device length defined by a back facet and a front facet;
   forming an internal grating located within said device body and adjacent said active region and said front facet and being closer to said front facet than to said back facet;
   layering an anti-reflective coating on said front facet; and
   forming external grated waveguide and coupling said waveguide to said front facet so as to provide an optical path between said active region and said waveguide.

10. The method as recited in claim 9, further including providing a lens located between said anti-reflective coating and said external grated waveguide.

11. The method as recited in claim 9, wherein providing includes providing a device body having a device length ($L_d$) and forming said external grated waveguide further includes forming an external grated waveguide that has a diffraction grating length ($L_g$) of less than about 4% of said device length ($L_d$).

12. The method as recited in claim 9, further including forming said external grated waveguide about 12 cm and about 102 cm from said front facet.

13. The method as recited in claim 9, wherein forming said internal grating comprises forming a diffraction grating whose length, when multiplied by a grating coupling constant of said diffraction grating, ranges from about 0.01 to about 0.15, and said diffraction grating is offset from said front facet by a distance ranging from about 0 $\mu$m to about 300 $\mu$m.

14. The method as recited in claim 13, further including forming said diffraction grating having a length less than about 4 percent of said device length.

15. The method as recited in claim 14, further including forming said device length of greater than about 1.3 mm, and forming said internal grating wherein said internal grating length ranges from about from about 10 $\mu$m to about 50 $\mu$m.

16. The method as recited in claim 14, further including forming a spacer layer having a thickness ranging from about 0.15 μm to about 1 μm between said internal grating and said active region.

17. An optical communications system, comprising:
  an optical device, including;
    a device body including an active region having a device length defined by a back facet and a front facet and an internal grating located adjacent said active region and said front facet and being closer to said front facet than to said back facet;
    an anti-reflective coating on said front facet; and
    an external grated waveguide located adjacent said front facet, said grated waveguide configured to cause a portion of radiation emanating from said device body to be reflected back through said front facet and into said device body;
  an optical waveguide coupled to said external grated waveguide; and
  an optical transmitter device and receiver device coupled to said optical device.

18. The optical communications system as recited in claim 17 wherein said optical device is a laser and said system further includes devices coupled to said optoelectronic device that are selected from the group consisting of:
  photodetectors,
  optical combiners, and
  optical amplifiers.

19. The optical communications system as recited in claim 17, wherein said device body has a device length ($L_d$) and said external grated waveguide has a diffraction grating length ($L_g$) of less than about 4% of said device length ($L_d$).

20. The optical communications system as recited in claim 17, further including said grated waveguide located between about 12 cm and about 102 cm from said front facet.

* * * * *